United States Patent [19]

Murakami et al.

[11] Patent Number: 4,578,691
[45] Date of Patent: Mar. 25, 1986

[54] PHOTODETECTING DEVICE

[75] Inventors: Toshiaki Murakami; Yoichi Enomoto, both of Mito; Minoru Suzuki, Katsuta, all of Japan

[73] Assignee: Nippon Telephone & Telegraph Public Corporation, Tokyo, Japan

[21] Appl. No.: 651,069

[22] Filed: Sep. 14, 1984

[30] Foreign Application Priority Data

Sep. 20, 1983 [JP] Japan .................... 58-173668

[51] Int. Cl.$^4$ ........................... H01L 39/22
[52] U.S. Cl. ........................... 357/5; 357/59; 357/30
[58] Field of Search ............... 357/5, 4, 59, 30

[56] References Cited

U.S. PATENT DOCUMENTS 4,316,785  2/1982  Suzuki .................... 357/5 X
4,521,682  6/1985  Murakami ............... 357/5 X Primary Examiner—Martin H. Edlow
Attorney, Agent, or Firm—Frishauf, Holtz, Goodman & Woodward

[57] ABSTRACT

A photodetecting device having Josephson junctions, comprises an insulating substrate, a polycrystalline superconductor film formed on the insulating substrate such that Josephson junctions are formed at grain boundaries, the superconductor film having a first region subjected to light illumination, and second and third regions formed contiguously at both sides of the first region such that a width of each of the second and third regions is wider than that of the first region, a bias circuit for supplying a predetermined bias current between the second and third regions, and an output circuit for detecting a change in voltage between the second and third regions, one terminal of said bias circuit and one terminal of said output circuit being commonly grounded, wherein the superconductor film comprises $BaPb_{1-x}Bi_xO_3$ (where $0.05 \leq x < 0.32$) having an I-V characteristic of weak link type under temperature condition less than transition temperature of said $BaPb_{1-x}Bi_xO_3$. This simple photodetecting device can detect an optical signal at high speed with high sensitivity.

5 Claims, 11 Drawing Figures

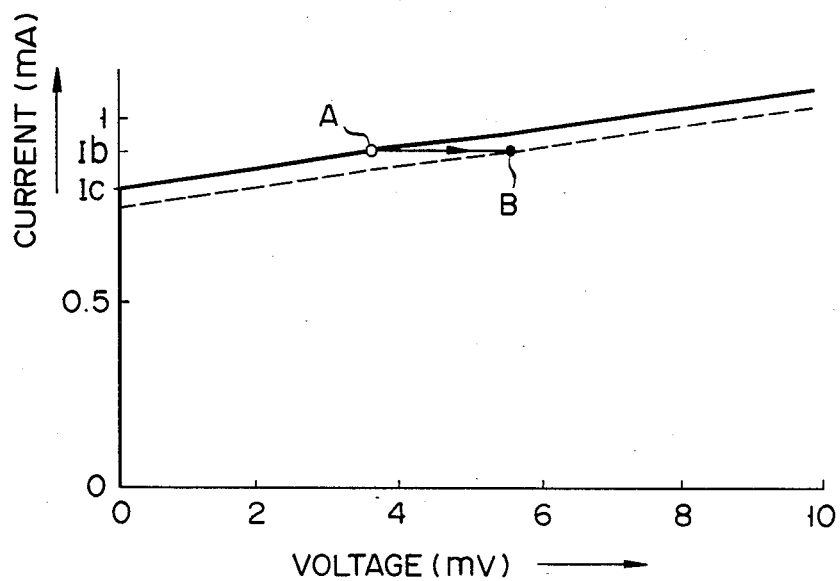
F I G. 6
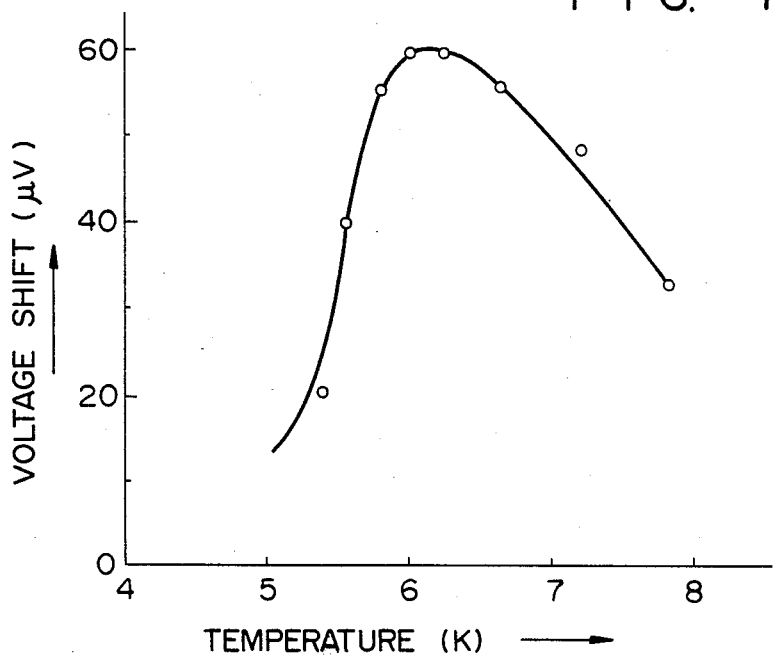
F I G. 7

PHOTODETECTING DEVICE

BACKGROUND OF THE INVENTION

The present invention relates to a photodetecting device and, more particularly, to a photodetecting device having a polycrystalline superconductor film which has Josephson junctions at its grain boundaries. A photodetecting device utilizing Josephson junctions shown in FIG. 1 was described by Enomoto et al in a lecture article issued by the Institute of Electronics and Communication Engineers of Japan.

Referring to FIG. 1, reference numeral 1 denotes a cross-shaped oxide superconductor pattern of $BaPb_{0.7}Bi_{0.3}O_3$ formed on a sapphire substrate 2 and having a thickness of 300 nm. The pattern 1 comprises a region 3, which is irradiated with light and located at the center of the pattern, a pair of input regions 4 and 4' extending from the region 3 to the left and right, and a pair of output regions 5 and 5' extending from the region 3 in the upper and lower directions. An input circuit (not shown) is connected to the input regions 4 and 4' to cause a DC bias current to flow thereto. An output circuit (not shown) including a differential amplifier for measuring changes in voltages generated between the output regions 5 and 5' is connected to the output regions 5 and 5'.

In the photodetecting device having the arrangement described above, when light irradiates the region 3 from an illuminating means (not shown) while a predetermined DC current flows from the input circuit to the pair of input regions 4 and 4', a change in voltage between the output regions 5 and 5' occurs. This voltage change is measured by the output circuit. In this manner, light can be detected. In general, the Josephson junctions require an electromagnetic shield and sufficient ground means to eliminate induction noise caused by background electromagnetic waves other than the target signal, since the Josephson junctions have high electromagnetic sensitivity.

However, in the photodetecting device shown in FIG. 1, the input and output circuits are independently arranged, so common ground is not present between the input and output circuits. Thus, it is difficult to decrease the induction noise level to a target level.

SUMMARY OF THE INVENTION

It is an object of the present invention to provide a photodetecting device having Josephson junctions and a simple construction, that allows highly sensitive detection of an optical signal, and can reduce background noise.

It is another object of the present invention to provide a photodetecting device having Josephson junctions which can be stably operated even when a signal input is large, or when background noise is high.

In order to achieve the above objects of the present invention, there is provided a photodetecting device having Josephson junctions, comprising:

an insulating substrate;

a polycrystalline superconductor film formed on said insulating substrate such that Josephson junctions are formed at grain boundaries, said superconductor film having a first region subjected to light illumination, and second and third regions formed contiguously at both sides of said first region such that a width of each of said second and third regions is wider than that of said first region;

means for supplying a predetermined bias current between said second and third regions; and means for detecting a change in voltage between said second and third regions, one terminal of said means for supplying and one terminal of said means for detecting being commonly grounded, wherein said superconductor film comprises $BaPb_{1-x}Bi_xO_3$ (where $0.05 \leq x < 0.32$) having an I-V characteristic of weak link type under temperature condition less than transition temperature of said $BaPb_{1-x}Bi_xO_3$.

The wavelength of an optical signal effectively detected by the photodetecting device of the present invention falls within the range of 1 to 10 μm.

BRIEF DESCRIPTION OF THE DRAWINGS

FIG. 6 is a graph showing the I-V characteristic curves in electrode regions 22A and 22B when light irradiates and does not irradiate a region 21 of the photodetecting device of this invention shown in FIG. 2;

FIG. 7 is a graph showing the relationship between the temperature and sensitivity in the weak link region of the charcteristic curve, when $x=0.3$ (transition temperature: about 8 K);

DETAILED DESCRIPTION OF THE PREFERRED EMBODIMENTS

Figure 1:
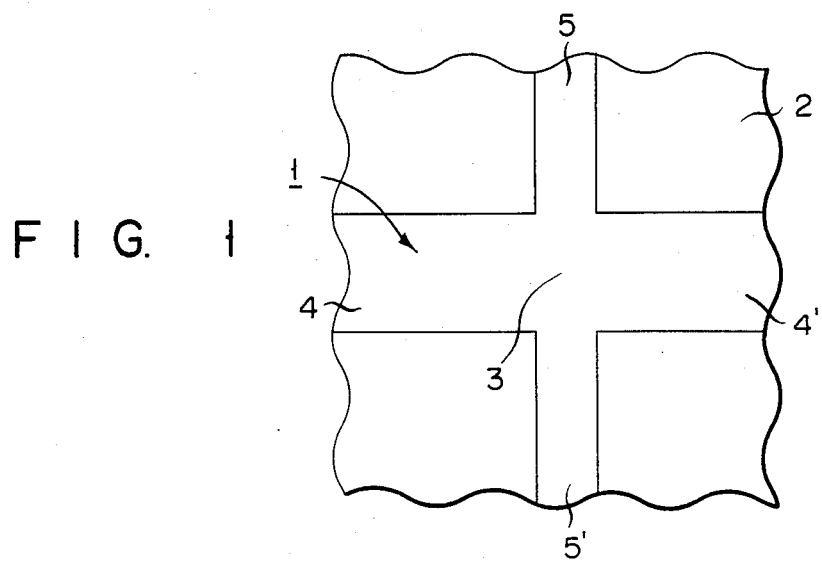
FIG. 1 is a schematic plan view of a conventional photodetecting device having Josephson junctions.

A photodetecting device having Josephson junctions according to an embodiment of the present invention will now be described with reference to FIG. 2.

Reference numeral 11 denotes a polycrystalline superconductor film of 2,000 Å to 4,000 Å thickness formed on a substrate 12 made of an insulating material such as sapphire. The superconductor film 11 comprises a region 21 having a width (W1) of 50 μm, length (L1) of 50 μm which is irradiated with light, and electrode regions 22A and 22B which respectively have a larger width (W2) than that of the region 21 and which extend therefrom in the opposite directions with respect to each other.

Figure 3:
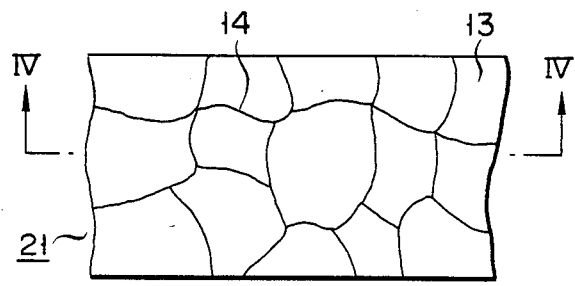
FIG. 3 is an enlarged plan view showing part of the photodetecting device of the device shown in FIG. 2.
Figure 4:
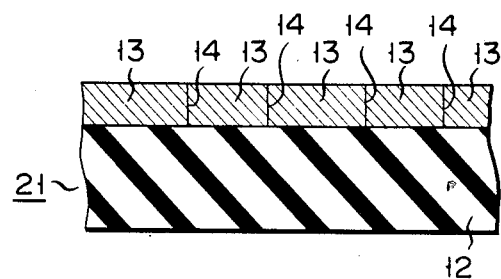
FIG. 4 is a cross-sectional view of the photodetecting device shown in FIG. 2 taken along the line IV—IV of FIG. 3.
Figure 5:
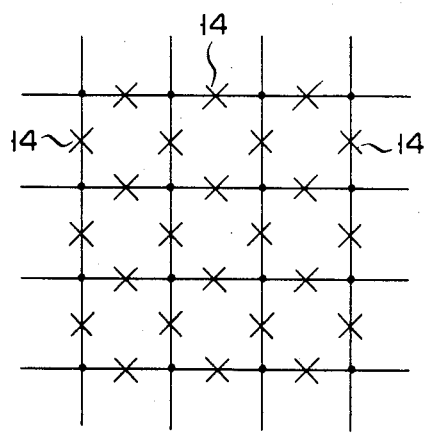
FIG. 5 is an equivalent circuit diagram of the light irradiated region of the photodetecting device shown in FIG. 3.

FIG. 3 is an enlarged plan view showing part of the region 21, and FIG. 4 is a sectional view thereof along the line IV—IV of FIG. 3. As shown in FIGS. 3 and 4, Josephson junctions 14 are formed at boundaries between grains 13 in the polycrystalline superconductor film 11. Therefore, the equivalent circuit of the Josephson junction 14 in the region 21, as shown in FIG. 5, has a matrix arrangement. An bias circuit is connected between the electrode regions 22A and 22B to supply a predetermined bias current therethrough. This bias circuit has a DC power supply 25 connected to contact films 23 and 24 which are respectively formed by deposition of gold on the electrode regions 22A and 22B. A node between the negative terminal of the DC power supply 25 and the contact film 24 is grounded. On the other hand, an output circuit (e.g., voltage detector 26) is connected to the electrode regions 22A and 22B. Reference numeral 27 denotes a contact film formed by deposition of gold on the electrode region 22A. One terminal of the voltage detector 26 is connected to the contact film 27, and the other terminal of the voltage detector 26 is connected to the contact film 24. The influences such as noise given by the bias current to the voltage detector 26 are suppressed by separating the contact film 23 and the contact film 27 from each other on the electrode region 22A.

In the arrangement described above, the device is kept at constant current bias. When light irradiates the region 21 from a light irradiating means (not shown) such as an optical fiber, quasiparticles are created in the region 21 and change the superconductor energy gap ($2\Delta$). The energy gap change causes the output voltage change of the Josephson junctions. Therefore, light is detected by measuring the change of the output voltage. In addition, the contact film 24 is formed on the electrode region 22B and is commonly used for the bias and output circuits. Therefore, the bias and output circuits commonly use one ground. As a result, the induction noise in the bias and output circuits can be easily decreased by a simple construction.

The width of the light radiation region 21 of the superconductor film 11 is smaller than that of each of the electrode regions 22A and 22B. When a bias current flows, the particular construction permits the current density in only the region 21 to the greater than the critical value so as to put the region 21 alone under a voltage state. With a current density the regions 22A, 22B hold below the critical value so as to keep the superconducting state in the regions 22A, 22B. Where the regions 22A, 22B are transformed into a voltage state, it is difficult to detect the change in the voltage under irradiation. It is sufficient for the regions 22A, 22B to be about 1.5 times as wide as the region 21, and an increased width of the regions 22A, 22B permits diminishing the inductance, leading to an improvement in the high frequency characteristics.

The polycrystalline superconductor film 11 formed at the crystal boundary comprises $BaPb_{1-x}Bi_xO_3$ (where $0.05 \leq x < 0.32$). The superconductor film 11 is formed by sputtering method on a substrate. The superconductor film is annealed in an oxygen atmosphere, and the annealed film is patterned to obtain the above-mentioned polycrystalline superconductor film 11.

For example, a $Ba(Pb_{0.75}Bi_{0.25})_{1.5}O_4$ ceramic plate was used as a target, and an insulating substate 12 was heated at a temperature of 260° C. in an atmosphere (pressure of $5 \times 10^{-3}$ Torr) of a gas mixture (ratio of 50:50) of argon and oxygen, and a plate voltage was 1.5 kV. Under these conditions, a thin $BaPb_{0.75}Bi_{0.25}O_3$ film was formed by magnetron sputtering on the insulating substrate 12. The insulating substrate 12 having the thin film described above was placed in an alumina vessel together with PbO or $Pb_3O_4$ powder and was annealed in an oxygen atmosphere at a temperature of 550° C. for 12 hours. As a result, a polycrystalline superconductor film of $BaPb_{1-x}Bi_xO_3$ (where $0.05 \leq x < 0.32$) was formed on the insulating substrate 12. Subsequently, the resultant polycrystalline superconductor film was etched by an etchant using an aqueous solution containing 30% $HClO_4$ and 0.5% HCl. The transition temperature (Tc) of the resultant polycrystalline superconductor film 11 was about 8° K.

Characteristics of this photodetecting element will be described with reference to FIG. 6.

First, the influence of light irradiation on superconductive characteristics will briefly be described below. In a superconductive state, Cooper pairs of electrons are formed and at an energy level lower by $\Delta$ than the Fermi level. Single electrons (quasiparticles) which do not become Cooper pairs exist at temperatures above absolute zero, and have a higher energy level than the Fermi level by $\Delta$ or more. A superconductor energy gap of $2\Delta$ exists between an electron state having the lowest energy level of these quasiparticles and a level of the Cooper pairs. A junction current at a zero voltage, that is, a maximum current density Jc of a Josephson current is represented as follows:

$$Jc = (\pi/2)\{\Delta(T)h/R_Ne\} \cdot tanh\{\Delta(T)/2k_BT\} \quad (1)$$

where $\Delta(T)$ means that energy gap is a function of temperature, $R_N$ is the junction resistance in a normal conduction state, h is Planck's constant, e is the electrical charge of an electron, and $k_B$ is Boltzmann's constant. In this manner, a maximum Josephson current density Jc is proportional to $\Delta(T)$. A current (critical current) Ic of the element can be obtained by multiplying Jc by the area of the element. When the element is used in practice, the element is set at a predetermined temperature. Therefore, the temperature dependency of energy $\Delta$ will not be considered hereinafter. According to Owen and Scalapino, when a quasiparticle density is $n(cm^{-3})$, $\Delta$ is represented as follows:

$$\Delta(n)/\Delta(O) = 1 - \{n/2N(O)\Delta(O)\} \quad (2)$$

When n is increased, $\Delta(n)$ is decreased, $\Delta(n)$ and $\Delta(O)$ are respectively values of $\Delta$ when the quasiparticle density is n and O. N(O) is the state density in a Fermi level.

In a state wherein light irradiates a superconductive material, the Cooper pairs are destroyed and quasiparticles are formed in comparison to a nonirradiation state. Therefore, when n becomes large, $\Delta$ becomes small. For this reason, the maximum Josephson current density Jc in equation (1) is different between the light irradiation state and the light nonirradiation state, and current-voltage characteristics thereof are also different.

The current-voltage characteristics in the nonirradiation state in the present invention become as indicated by the solid line in FIG. 6, and those of the irradiation state become as indicated by the broken line therein. In FIG. 6, assume that when a bias current Ib, which is larger than the maximum Josephson current Ic, is made to flow between the films 23 and 24 in the nonirradiation state (solid line), an operating point of the element is given by a point A. In this biasing state, when light irradiates the region 21 of FIG. 2, quasiparticles are formed, and Δ is decreased. For this reason, the operating point shifts to a point B, thereby changing the output voltage of the element. Since this change in the output voltage is proportional to n and is therefore proportional to a light amount, the photodetecting operation can be performed by measuring the change in the output voltage.

FIG. 6 shows characteristics of a so-called weak link type device having no hysteresis. $BaPb_{1-x}Bi_xO_3$ having these characteristics is used in the present invention. In order to obtain such weak link type characteristics, the potential barrier at the boundaries between grains must be lowered. For example, in $BaPb_{1-x}Bi_xO_3$, the content of Bi, that is, the value of x is controlled, thereby obtaining the characteristics of a weak link type device having no hysteresis. Alternatively, this can be achieved by increasing the operating temperature (i.e., being made to approach a transition temperature Tc).

The present inventors confirmed that, in $BaPb_{1-x}Bi_xO_3$, where $0.05 \leq x < 0.275$, weak link type characteristics were obtained within the operating temperature range below the transition temperature (e.g., 4.2 K), and where $0.275 \leq x < 0.32$ (transition temperature Tc=8 to 9 K), they were obtained within the operating temperature range from about 5 K up to a temperature below the transition temperature. Particularly, with x in the range of $0.275 \leq x < 0.32$ and at the operating temperature of 5 to 8 K, a weak link type device having good photosensitivity could be obtained. A maximum photosensitivity was obtained when x was 0.3 and the operating temperature was 6.5 K.

FIG. 7 shows the relationship between the operating temperature and the photosensitivity in a region having weak link type characteristics when x is 0.3 (the transition temperature being about 8 K). Generally, the advantage of allowing a high operating temperature is that control is facilitated. In other words, particularly good photoconductivity can be obtained with x in the range of $0.275 \leq x < 0.32$ and at the operating temperature of 5 to 7 K.

Influence of the composition ratio of $BaPb_{1-x}Bi_xO_3$ other than that defined in the present invention on the characteristics of the photodetecting element will be briefly described hereinafter. In the configuration of FIG. 2, when the composition ratio of $0.32 \leq x < 0.35$ is set, the current-voltage characteristics both in the light irradiation state and nonirradiation state are respectively represented by solid line curves 1, 2 and 3 and broken line curves 1', 2' and 3' in FIG. 8. Therefore, in the light nonirradiation state, the operating point is set at a point C on the solid line curve 2 by a predetermined biasing state. Then, when light irradiates in the light irradiation mode, the operating point shifts to a point D on the broken line curve 2'. This voltage change is detected so as to perform the photodetecting operation.

Figure 8:
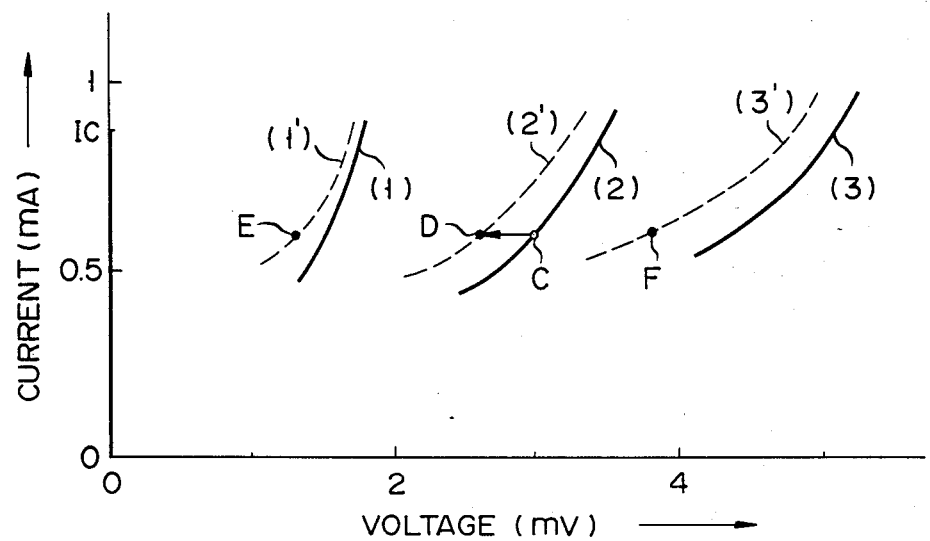
FIG. 8 is a graph showing the I-V characteristic curves of similar photo-detecting device to this invention except value of x.

However, in the composition ratio of $0.32 \leq x < 0.35$ described above and in the element which has characteristics having hysteresis as shown in FIG. 8, when the light amount is high, or when background noise is large, the operating point shifts to other points (e.g., from point C of the curve 2 to points E or F having the same current value of the curve 1' or 3'), resulting in an unstabilized operation.

On the otherhand, in the present invention, the composition ratio of $0.05 \leq x \leq 0.32$ is used, thereby realizing the characteristics of a weak link type device having no hysteresis. Therefore, the above disadvantage of unstabilized operation can be prevented.

Note that when the composition ratio is $0.32 \leq x \leq 0.35$, hysteresis occurs, and when $0.35 < x$, only a semiconductor state can be provided, and when $x < 0.05$, superconductive state cannot be provided. None of these cases can achieve weak link type characteristics and therefore can be adopted in the present invention.

Figure 9:
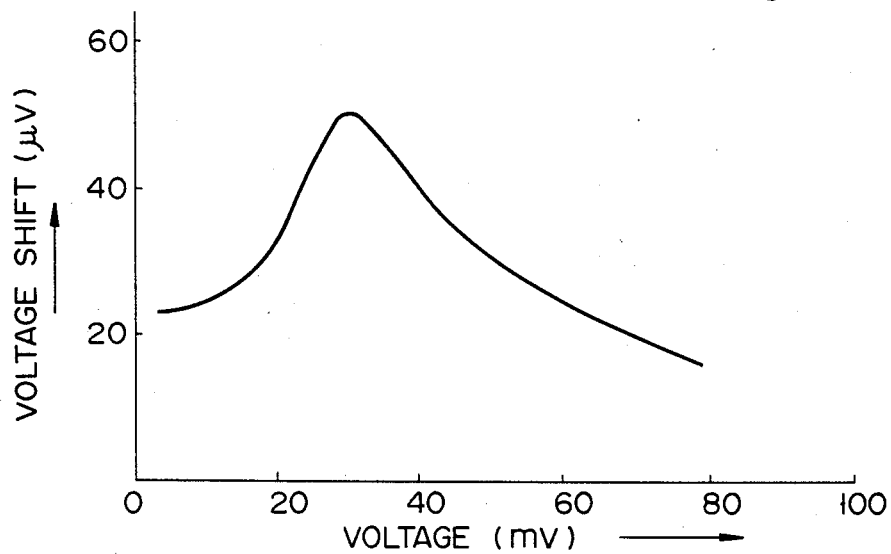
FIG. 9 shows the bias voltage dependence of voltage shift between A and B by irradiation under same optical power.

FIG. 9 shows the bias voltage dependence of voltage shift between A and B by irradiation under same optical power.

Figure 10:
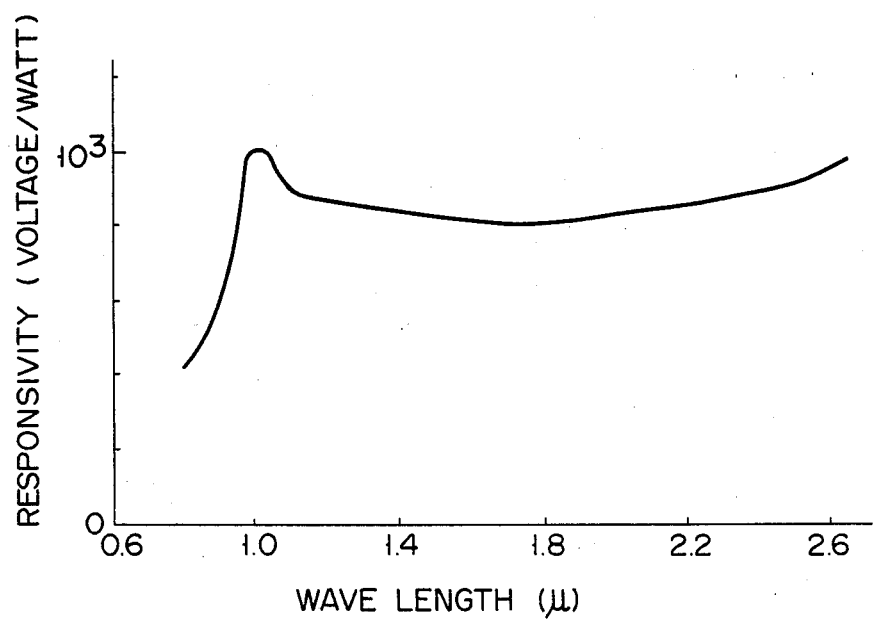
FIG. 10 shows the wavelength dependence of a responsivity.

FIG. 10 shows the wavelength dependence of a responsivity. The superconductive energy gap is nearly equal to 2 meV, which is three orders of magnitude narrower than those of ordinary semiconductors. Therefore, this optical detector will be given a province in the infrared wavelength range.

Figure 2:
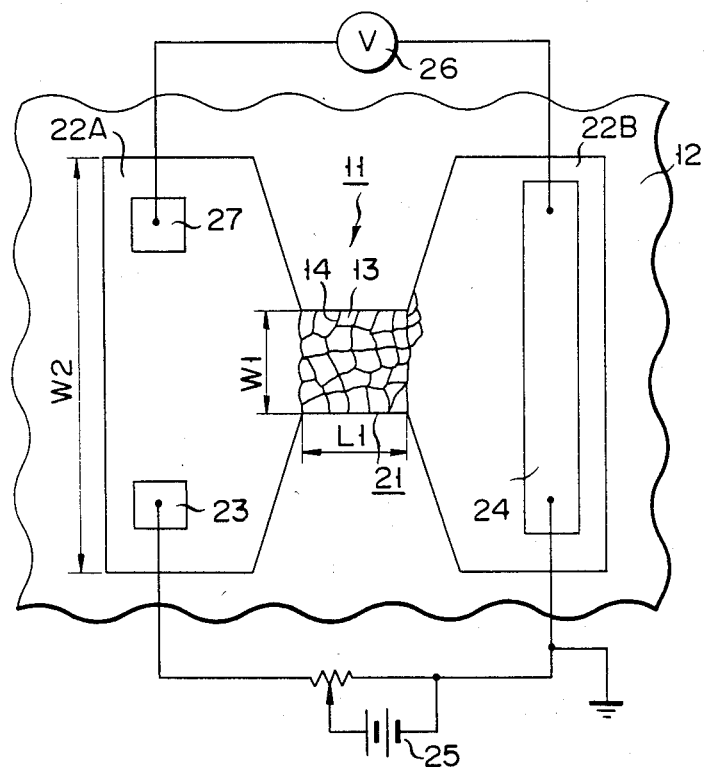
FIG. 2 is a schematic plan view of a photodetecting device having Josephson junctions according to an embodiment of the present invention.
Figure 11:
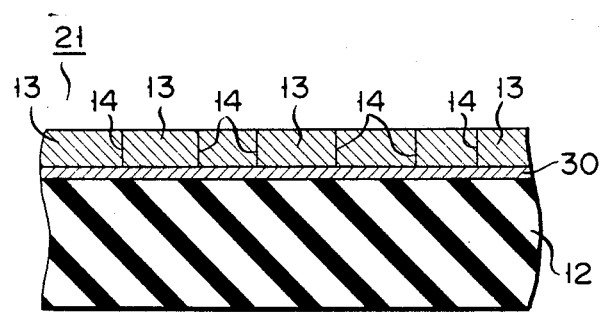
FIG. 11 is a sectional view of a photodetecting device according to another embodiment of the present invention.

The photodetecting device shown in FIG. 11 is substantially the same as that shown in FIGS. 2, 3 and 4 except that a reflecting film 30 is formed between a superconductor film 11 and a substrate 12. The reflecting film 30 serves to prevent light from being transmitting to the substrate 12 through the superconductor film 11. As a result, the light detecting sensitivity of the photodetecting device can be further improved. The reflecting film 30 may comprise a metal layer made of silver, platinum or the like and formed on the substrate 12, and a thin insulating layer for short-circuit prevention. It should be noted that the same reference numerals used in FIG. 11 denote the same parts as in FIG. 4.

The present invention utilizes a polycrystalline superconductor having a semiconductor like nature such as $BaPb_{1-x}Bi_xO_3$ ($0.05 \leq x < 0.32$). Unlike the conventional metal superconductor, the polycrystalline superconductor used in the present invention readily permits light to permeates thereinto. Also, a mesh-like Josephson junction formed at the boundary of the crystal grains of the superconductor thin film is utilized for detecting the change of energy gap in the present invention. The use of the polycrystalline superconductor permits markedly improving the sensitivity to light having a wavelength of 0.8 to 10 μm. Also, the change of voltage is markedly increased by the adding effect at the point where the Josephson junctions are connected in series, making it possible to obtain a photodetecting device of a very high sensitivity. What should also be noted is that the bias current supply means and the voltage detecting means can be commonly connected to the ground in the present invention, making it possible to provide a photodetecting device strong against noises.

More particularly, in the photodetecting device of the present invention, when the operating temperature is set between the transition temperature of the polycrystalline superconductor film and 4.2 K, the current-voltage characteristics thereof are not of the hysteresis type but of the weak link type. Therefore, even when a signal input is large or when background noise is high, the operation can be stabilized.

What is claimed is:
1. A photodetecting device having Josephson junctions, comprising:
   an insulating substrate;
   a polycrystalline superconductor film of $BaPb_{1-x}Bi_xO_3$ (where $0.05 \leq x < 0.32$) having an I-V characteristic of weak link type under temperature condition less than transition temperature of said $BaPb_{1-x}Bi_xO_3$, formed on said insulating substrate such that Josephson junctions are formed at grain boundaries, said superconductor film having a first region subjected to light illumination, and second and third regions formed contiguously at both sides of said first region such that a width of each of said second and third regions is wider than that of said first region;

means for supplying a predetermined bias current between said second and third regions; and means for detecting a change in voltage between said second and third regions, one terminal of said means for supplying and one terminal of said means for detecting being commonly grounded.

2. A device according to claim 1, wherein a light-reflecting layer is formed between said substrate and said superconductor film.

3. A device according to claim 1, wherein said x is from 0.275 to 0.32 and said temperature condition is from about 5° K. to less than transition temperature.

4. A device according to claim 1, wherein said x is about 3 and said temperature condition is near 6.5° K.

5. A device according to claim 1, wherein said each width of said second and third regions is 1.5 times or more as wide as that of said first region.

* * * * *

UNITED STATES PATENT AND TRADEMARK OFFICE
CERTIFICATE OF CORRECTION

PATENT NO. : 4,578,691
DATED : March 25, 1986
INVENTOR(S) : T. MURAKAMI et al

It is certified that error appears in the above-identified patent and that said Letters Patent is hereby corrected as shown below:

The "Assignee" data should read as follows:

--Nippon Telegraph & Telephone Public Corporation--

Signed and Sealed this

Fifth Day of August 1986

[SEAL]

Attest:

DONALD J. QUIGG

Attesting Officer

Commissioner of Patents and Trademarks